(12) United States Patent
Wang et al.

(10) Patent No.: US 9,035,811 B2
(45) Date of Patent: May 19, 2015

(54) ANALOG DIGITAL DATA CONVERSION METHOD, ANALOG DIGITAL DATA CONVERTER, AND ANALOG DIGITAL CONVERSION CHIP

(71) Applicant: Huawei Technologies Co., Ltd., Shenzhen (CN)

(72) Inventors: Yong Wang, Shanghai (CN); Xiaoming Shi, Shanghai (CN); Yulin Li, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 14/564,998

(22) Filed: Dec. 9, 2014

(65) Prior Publication Data

US 2015/0109156 A1    Apr. 23, 2015

Related U.S. Application Data

(63) Continuation of application No. PCT/CN2013/076627, filed on Jun. 3, 2013.

(30) Foreign Application Priority Data

Jun. 27, 2012 (CN) .......................... 2012 1 0215608

(51) Int. Cl.
*H03M 1/00* (2006.01)
*H03M 1/12* (2006.01)

(52) U.S. Cl.
CPC ..................................... *H03M 1/123* (2013.01)

(58) Field of Classification Search
CPC . H03M 1/123; H03M 1/1225; H03M 1/1205; H03M 1/1215
USPC .................................................... 341/141, 155
See application file for complete search history.

(56) References Cited

U.S. PATENT DOCUMENTS

| 6,473,013 | B1 * | 10/2002 | Velazquez et al. | 341/120 |
| 6,657,574 | B1 * | 12/2003 | Rhode | 341/155 |
| 8,022,853 | B2 * | 9/2011 | Guido et al. | 341/155 |
| 8,548,100 | B2 * | 10/2013 | Fireaizen et al. | 375/340 |
| 2010/0259433 | A1 * | 10/2010 | Bishop et al. | 341/155 |

* cited by examiner

*Primary Examiner* — Khai M Nguyen
(74) *Attorney, Agent, or Firm* — Leydig, Voit & Mayer, Ltd.

(57) ABSTRACT

The present invention is applicable to the field of communication, and provides an analog digital data conversion method, an analog digital data convertor and an analog digital conversion chip. The method includes: converting multiple groups of analog data to multiple groups of digital data; performing frequency shift on the multiple groups of digital data, wherein the multiple groups of frequency shifted digital data are independently distributed within a first preset bandwidth; filtering the multiple groups of frequency shifted digital data to remove outband information; and distributing without overlap the filtered multiple groups of digital data within a second preset bandwidth. The method substantially reduces pressure of data transmission between the converter and an FPGA or ASIC, and effectively simplifying the design of a multiband receiver.

15 Claims, 5 Drawing Sheets

US 9,035,811 B2

ANALOG DIGITAL DATA CONVERSION METHOD, ANALOG DIGITAL DATA CONVERTER, AND ANALOG DIGITAL CONVERSION CHIP

CROSS-REFERENCE TO RELATED APPLICATION

This application is a continuation of International Patent Application No. PCT/CN2013/076627, filed on Jun. 3, 2013, which claims priority to Chinese Patent Application No. 201210215608.7, filed on Jun. 27, 2012, all of which are hereby incorporated by reference in their entireties.

TECHNICAL FIELD

The present invention relates to the field of communications technologies, and in particular, to an analog digital data conversion, an analog digital data convertor and an analog digital conversion chip.

BACKGROUND

At present, in current base station technologies of wireless communications, a received analog signal needs to be converted to a digital signal, and then operation processing is performed in the digital domain to implement various functions and achieve the objective of information transmission. An analog digital converter (ADC) discretizes an analog signal in terms of time and amplitude to convert the analog signal to a digital signal. Such devices are the most commonly used devices in existing analog and digital hybrid systems.

Existing ADC architectures are relatively commonly used digital interfaces with ADC parallel output, mostly in two forms. One form is that each converter core (ADC core) corresponds to one direct output interface, referring to FIG. 1, leading to numerous interfaces when multiple converters are used, which imposes pressure onto implementation of a back-end field-programmable gate array (FPGA) or application specific integrated circuit (ASIC).

A second form is that multiple converters correspond to one interface, and a multi-selector is used to output multiple ADC core output signals by means of time division multiplexing, referring to in FIG. 2. However, processing data by means of time division multiplexing does not reduce the throughput of an interface. Moreover, in existing communications systems or other ADC-equipped sampling systems, to avoid aliasing of digital signals, an actually used bandwidth is narrower than an actual Nyquist bandwidth, and therefore, there is much unnecessary information in the signals output by the interfaces. This part of information also occupies a substantial portion of the processing bandwidth of an interface.

SUMMARY

One objective of embodiments of the present invention is to provide an analog digital data conversion method to address the problem in the prior art that there are many analog digital conversion data transmission interfaces and a bandwidth utilization rate is low.

One objective of the embodiment of the invention is to provide an analog digital data conversion method, includes: converting multiple groups of analog data to multiple groups of digital data; performing frequency shift on the multiple groups of digital data, where the multiple groups of frequency shifted digital data are independently distributed within a first preset bandwidth; filtering the multiple groups of frequency shifted digital data to remove outband information; and distributing without overlap the filtered multiple groups of digital data within a second preset bandwidth.

Another objective of the embodiments of the invention is to provide an analog digital data convertor, includes: a plurality of analog digital conversion cores, configured to convert multiple groups of analog data to multiple groups of digital data and perform frequency shift on the multiple groups of digital data, where the multiple groups of frequency shifted digital data are independently distributed within a first preset bandwidth; a filtering unit, configured to filter the multiple groups of frequency shifted digital data, to remove outband information; and a combining unit, configured to distribute without overlap the filtered multiple groups of digital data within a second preset bandwidth.

Still another objective of the embodiments of the present invention is to provide an analog digital conversion chip which includes the above analog digital data convertor.

In the embodiments of the present invention, frequency shift is applied to data content by a plurality of analog digital conversion cores in an analog digital converter; unnecessary outband information is removed to fully utilize a transmission bandwidth of an interface; and valid information of the plurality of analog digital conversion cores is redistributed and transmitted highly-efficiently to a next level device for processing, which substantially reduces pressure on data transmission between the converter and an FPGA or ASIC, and effectively simplifies design of a multiband receiver.

DESCRIPTION OF EMBODIMENTS

To make the objectives, technical solutions, and advantages of the present invention more comprehensible, the following further describes the present invention in detail with reference to the accompanying drawings and embodiments. It should be understood that the specific embodiments described herein are merely used for describing the present invention, but are not intended to limit the present invention.

In the embodiments of the present invention, frequency shift is applied to data content by a plurality of analog digital conversion cores in an analog digital converter; unnecessary outband information is removed; and the filtered multiple groups of data information are redistributed on a frequency spectrum to combine the multiple groups of data information, which reduces the number of interfaces and improves bandwidth utilization.

Figure 1:
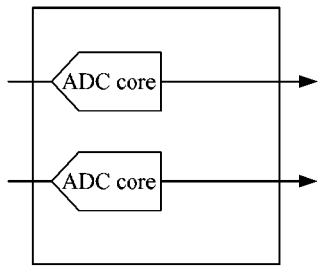
FIG. 1 is an architectural diagram of a one-to-one-interface analog digital converter in the prior art.
Figure 2:
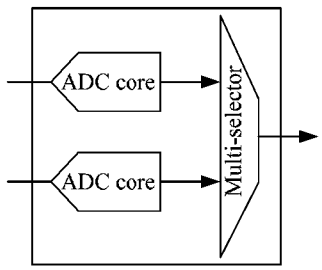
FIG. 2 is an architectural diagram of an analog digital converter with a time division multiplexing structure in the prior art.
Figure 3:
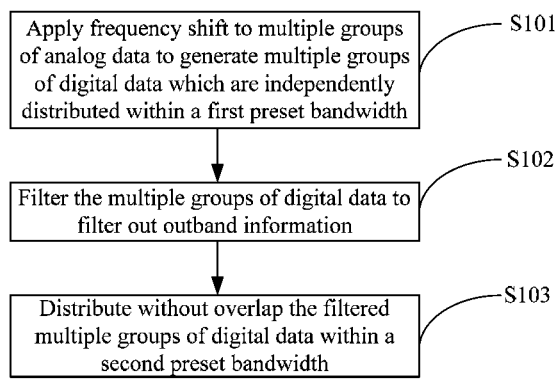
FIG. 3 is an implementation flowchart of an analog digital conversion data transmission method according to a first embodiment of the present invention.

FIG. 3 shows an implementation process of an analog digital conversion data transmission method according to a first embodiment of the present invention, which is detailed as follows:

In step S101, frequency shift is applied to multiple groups of analog data to generate multiple groups of digital data which are independently distributed within a first preset bandwidth.

Figure 4A:
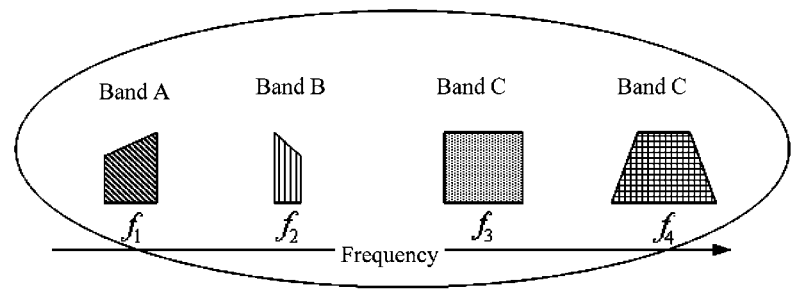
FIG. 4A to FIG. 4C are schematic diagrams of data conversion frequency spectrum of an analog digital conversion data transmission method according to an embodiment of the present invention.
Figure 4B:
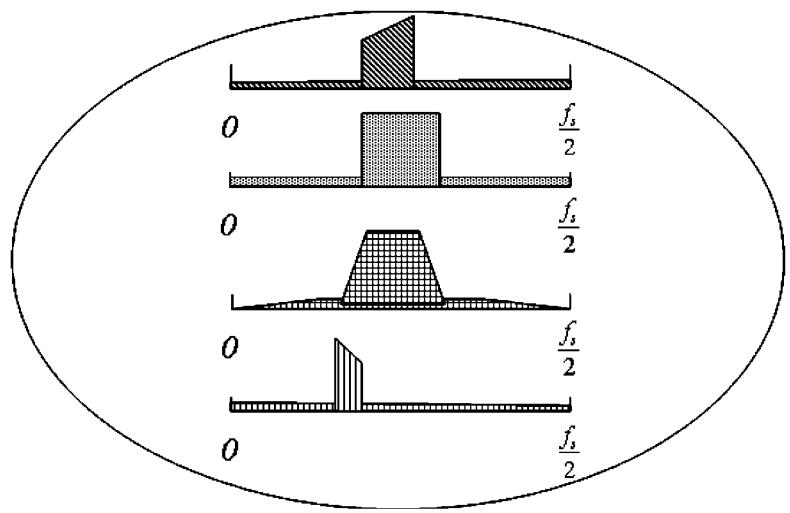

In the embodiment of the present invention, a plurality of ADC cores is integrated in a chip, and analog data band A, band B, band C and band D is distributed respectively around the center of frequencies f1, f2, f3 and f4, referring to in FIG. 4A. For this analog data, frequency shift is applied to data content by a plurality of ADC cores, and a frequency spectrogram of the data is shown in FIG. 4B, where each frequency band information is distributed independently within a bandwidth of $$0 - \frac{f_s}{2}.$$

In step S102, the multiple groups of digital data are filtered to remove outband information.

In the embodiment of the present invention, outband information, such as noise in the digital data and digital data outside a target, is removed respectively. For example, when the digital data generated after performing frequency shift on analog data Band A is filtered, the digital data outside the target includes digital data generated after performing frequency shift on analog data Band B, Band C and Band D as well as other unnecessary signals included or generated in the process of data conversion or processing. A filtering coefficient may be configured with a specific order according to a system requirement.

In step S103, the filtered multiple groups of digital data are distributed without overlap within a second preset bandwidth and output.

Figure 4C:
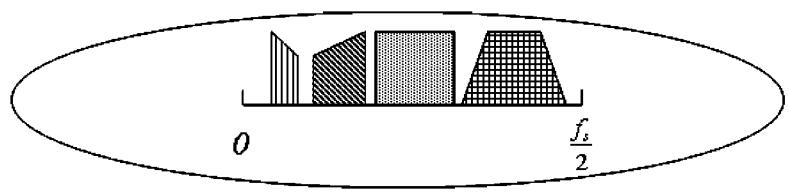

In the embodiment of the present invention, the filtered multiple groups of conversion information (digital data) are redistributed on a frequency spectrum, and the data of a plurality of ADC cores is combined, referring to in FIG. 4C, and output to a corresponding FPGA or ASIC via a parallel or serial interface, which implements aggregation and highly-efficient output. In step S103, the second preset bandwidth may be configured according to a specific need, and may not be the same as the first preset bandwidth in step S101.

In the embodiment of the present invention, frequency shift is applied to data content by a plurality of analog digital conversion cores in an analog digital converter; unnecessary outband information is removed to fully utilize a transmission bandwidth of an interface; and valid information of the plurality of analog digital conversion cores is redistributed and transmitted highly-efficiently to a next level device for processing, which substantially reduces pressure on data transmission between the converter and an FPGA or ASIC, and effectively simplifies design of a multiband receiver.

Figure 5:
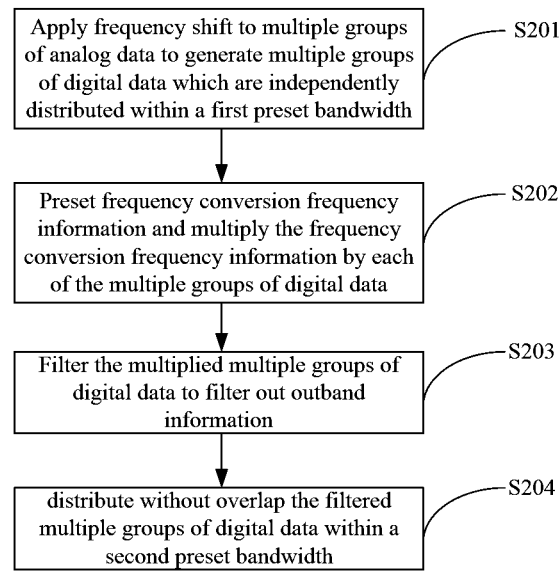
FIG. 5 is an implementation flowchart of an analog digital conversion data transmission method according to a second embodiment of the present invention.

FIG. 5 shows an implementation process of an analog digital conversion data transmission method according to a second embodiment of the present invention, which is detailed as follows:

In step S201, frequency shift is applied to multiple groups of analog data to generate multiple groups of digital data which are independently distributed within a first preset bandwidth.

In step S202, frequency information for frequency conversion is preset and multiplied by the multiple groups of digital data respectively.

In step S203, the multiplied multiple groups of digital data are filtered to remove outband information.

In the embodiment of the present invention, the digital data may be multiplied by the preset frequency information for frequency conversion and then filtered, to reduce complexity of filtering structure design when filtering is directly employed. The frequency information for frequency conversion may be configured according to a specific need.

In step S204, the filtered multiple groups of digital data are distributed without overlap within a second preset bandwidth and output.

Figure 6:
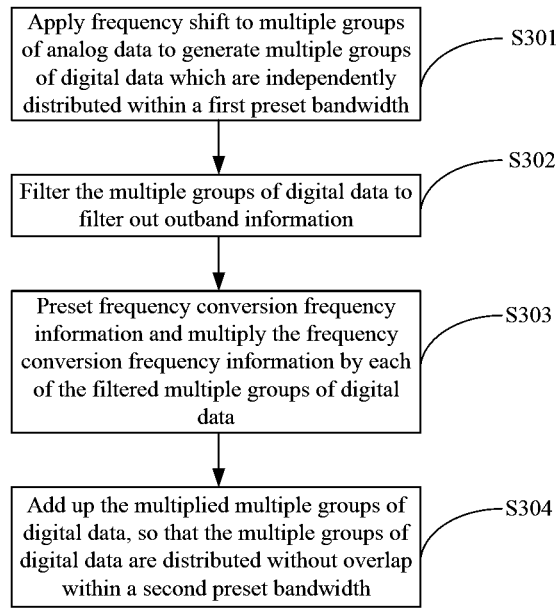
FIG. 6 is an implementation flowchart of an analog digital conversion data transmission method according to a third embodiment of the present invention.

FIG. 6 shows an implementation process of an analog digital conversion data transmission method according to a third embodiment of the present invention, which is detailed as follows:

In step S301, frequency shift is applied to multiple groups of analog data to generate multiple groups of digital data which are independently distributed within a first preset bandwidth.

In step S302, the multiple groups of digital data are filtered to remove outband information.

In step S303, frequency information for frequency conversion is preset and multiplied by the filtered multiple groups of digital data respectively.

In step S304, the multiplied multiple groups of digital data are added up, so that the multiple groups of digital data are distributed without overlap within a second preset bandwidth and output.

In the embodiment of the present invention, frequency information for frequency conversion is configured according to a specific need, and the frequency information for frequency conversion is multiplied by the multiple groups of digital data respectively and then added up, which implements combination of the multiple groups of digital data.

In the embodiment of the present invention, frequency shift is applied to data content by a plurality of analog digital conversion cores in an analog digital converter; unnecessary outband information is removed to fully utilize a transmission bandwidth of an interface; and valid information of the plurality of analog digital conversion cores is redistributed and transmitted highly-efficiently to a next level device for processing, which substantially reduces pressure on data transmission between the converter and an FPGA or ASIC, and effectively simplifies design of a multiband receiver.

Figure 7:
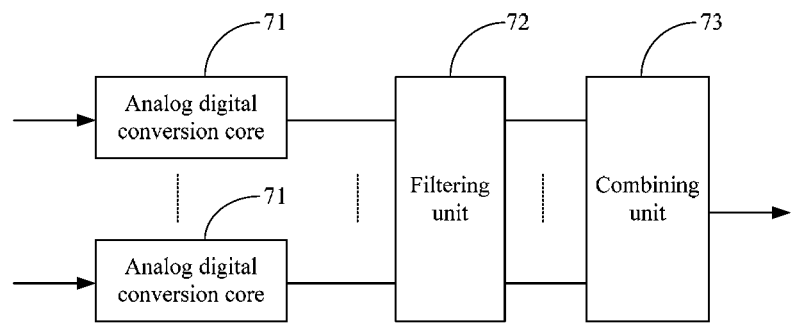
FIG. 7 is a structural diagram of an analog digital conversion data transmitter according to an embodiment of the present invention.

FIG. 7 shows a structure of an analog digital conversion data transmitter according to an embodiment of the present invention. To facilitate description, only parts related to the embodiment of the present invention are shown.

As an embodiment of the present invention, the analog digital conversion data transmitter 7 may be applied to various digital analog conversion chips, and includes:

a plurality of analog digital conversion cores 71, where input ends of the plurality of analog digital conversion cores 71 are a plurality of input ends of the analog digital conversion data transmitter 7, and the plurality of analog digital conversion cores 71 is configured to perform frequency shift on multiple groups of analog data input to the analog digital conversion data transmitter 7 to generate multiple groups of digital data which are independently distributed within a first preset bandwidth;

a filtering unit 72, where a plurality of input ends of the filtering unit 72 is connected respectively to output ends of the plurality of analog digital conversion cores 71, and the filtering unit 72 is configured to filter the multiple groups of digital data to remove outband information; and a combining unit 73, where a plurality of input ends of the combining unit 73 is connected respectively to the plurality of output ends of the filtering unit 72, output ends of the combining unit 73 are output ends of the analog digital conversion data transmitter 7, and the combining unit 73 is configured to distribute without overlap the filtered multiple groups of digital data within a second preset bandwidth and output the filtered multiple groups of digital data.

As an embodiment of the present invention, the filtering unit 72 may be implemented by using a digital filter and may be embedded into an analog digital conversion chip.

In the embodiment of the present invention, frequency shift is applied to data content by a plurality of analog digital conversion cores in an analog digital converter; unnecessary outband information is removed to fully utilize a transmission bandwidth of an interface; valid information of the plurality of analog digital conversion cores is redistributed and transmitted highly-efficiently to a next level device for processing, which substantially reduces pressure on data transmission between the converter and an FPGA or ASIC, and effectively simplifies design of a multiband receiver.

Figure 8:
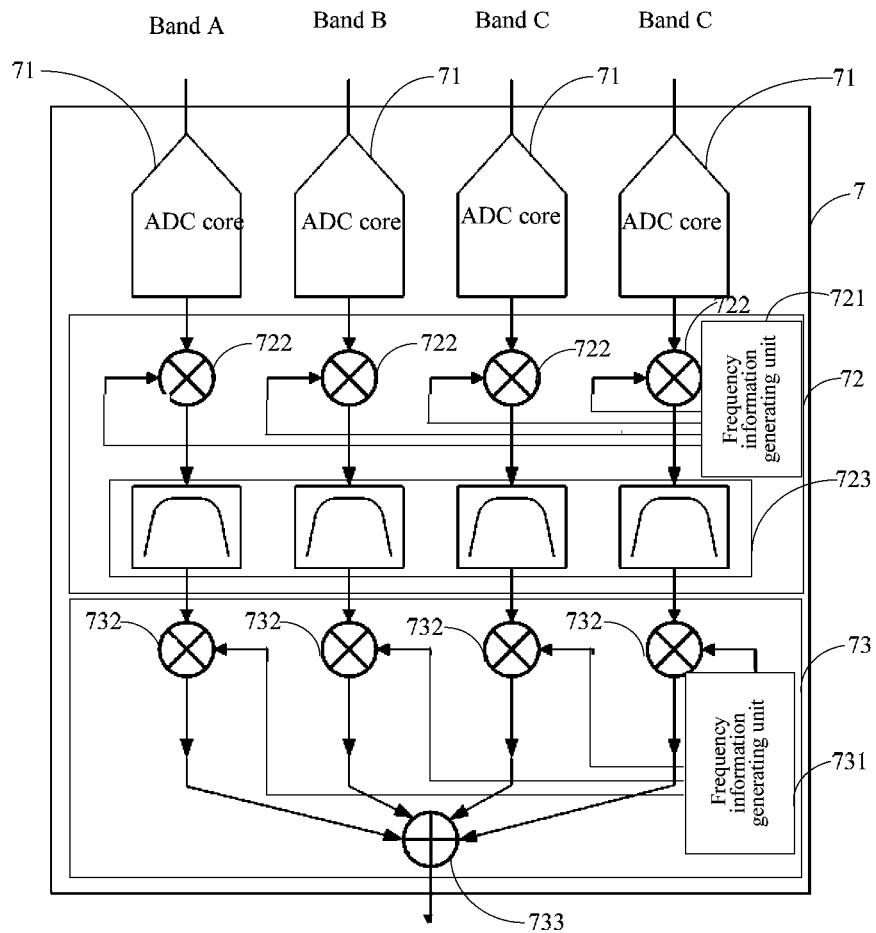
FIG. 8 is an exemplary structural diagram of an analog digital conversion data transmitter according to an embodiment of the present invention.

FIG. 8 shows an exemplary structure of an analog digital conversion data transmitter according to an embodiment of the present invention. To facilitate description, only parts related to the embodiment of the present invention are shown.

In the embodiment of the present invention, the filtering unit 72 includes:

a frequency information generating unit 721, configured to preset frequency information for frequency conversion;

a plurality of multipliers 722, where first input ends of the plurality of multipliers 722 are respectively a plurality of input ends of the filtering unit 72, second input ends of the plurality of multipliers 722 are connected respectively to a plurality of output ends of the frequency information generating unit 721, and the plurality of multipliers 722 is configured to multiply the preset frequency information for frequency conversion by the multiple groups of digital data respectively; and a filtering module 723, where a plurality of input ends of the filtering module 732 is connected respectively to output ends of the plurality of multipliers 722, and the filtering module 723 is configured to filter the multiplied multiple groups of digital data to remove outband information.

As an embodiment of the present invention, the frequency information generating unit 721 may be implemented by using a numerical controlled oscillator (numerical controlled oscillator, NCO).

As an embodiment of the present invention, the filtering module may be an infinite impulse response (Infinite Impulse Response, IIR) filter or a finite impulse response (Finite Impulse Response, FIR) filter.

Certainly, the filtering module 723 may be implemented by using an FIR filter with a Half Band Filter (Half Band Filter, HBF) or Cascaded Integrator Comb filter (Cascaded Integrator Comb filter, CIC) structure.

The combining unit 73 includes:

a frequency information generating unit 731, configured to preset frequency information for frequency conversion;

a plurality of multipliers 732, where first input ends of the plurality of multipliers 732 are respectively a plurality of input ends of the combining unit 73, second input ends of the plurality of multipliers 732 are connected respectively to a plurality of output ends of the frequency information generating unit 731, and the plurality of multipliers is configured to multiply the preset frequency information for frequency conversion by the filtered multiple groups of digital data respectively; and an adder 733, where a plurality of input ends of the adder 733 is connected respectively to output ends of the plurality of multipliers 732, an output end of the adder 733 are an output end of the combining unit 73, and the adder 733 is configured to add up the multiplied multiple groups of digital data, so that the multiple groups of digital data are distributed without overlap within a second preset bandwidth and output.

As an embodiment of the present invention, the frequency information generating unit 731 may be implemented by using a numerical controlled oscillator (numerical controlled oscillator, NCO).

As an embodiment of the present invention, an analog digital conversion chip is provided, where the analog digital conversion chip includes the above analog digital conversion data transmitter.

In the embodiment of the present invention, frequency shift is applied to data content by a plurality of analog digital conversion cores in an analog digital converter; unnecessary outband information is removed; and the filtered multiple groups of digital data information are redistributed on a frequency spectrum so that the multiple groups of digital data are combined; and the combined data is finally transmitted to a corresponding FPGA or ASIC via a parallel or serial interface.

The embodiments of the present invention have the following benefits:

(1) Interface capacity of a converter containing multiple ADC cores is optimized, thereby reducing interfaces which must previously be allocated independently.

(2) Valid information capacity of an output interface of a multi-core converter is increased, and bandwidth utilization of an interface is increased substantially by removing unnecessary outband information and placing remaining valid information, thereby greatly reducing requirements for the parallel interface bit width rate and serial interface rate.

(3) Early stage design of an ASIC is greatly benefited, where, at the early stage design of an ASIC, it is difficult to determine the number of corresponding converter interfaces. By using the present invention, interfaces can be reserved according to a maximum digital bandwidth of internal processing and a corresponding proportion.

The foregoing descriptions are merely exemplary embodiments of the present invention, but are not intended to limit the present invention. Any modification, equivalent replacement, and improvement made within the principle of the present invention shall fall within the protection scope of the present invention.

What is claimed is:

1. An analog digital data conversion method, comprising:
   converting multiple groups of analog data to multiple groups of digital data;
   performing frequency shift on the multiple groups of digital data, wherein the multiple groups of frequency shifted digital data are independently distributed within a first preset bandwidth;
   filtering the multiple groups of frequency shifted digital data to remove outband information; and distributing without overlap the filtered multiple groups of digital data within a second preset bandwidth.

2. The method according to claim 1, wherein the filtering the multiple groups of frequency shifted digital data to remove the outband information, comprises:
   presetting frequency information for frequency conversion;
   multiplying the frequency information by the multiple groups of frequency shifted digital data respectively; and
   filtering the multiplied groups of digital data to remove outband information.

3. The method according to claim 1, wherein the distributing without overlap the filtered multiple groups of digital data within the second preset bandwidth, comprises:
   presetting frequency information for frequency conversion; and
   multiplying the frequency information by the filtered multiple groups of digital data respectively; and
   adding up the multiplied groups of digital data, so that the multiple groups of digital data are distributed without overlap within the second preset bandwidth.

4. An analog digital data convertor, comprising:
   a plurality of analog digital conversion cores, configured to convert multiple groups of analog data to multiple groups of digital data and perform frequency shift on the multiple groups of digital data, wherein the multiple groups of frequency shifted digital data are independently distributed within a first preset bandwidth;
   a filtering unit, configured to filter the multiple groups of frequency shifted digital data, to remove outband information; and
   a combining unit, configured to distribute without overlap the filtered multiple groups of digital data within a second preset bandwidth.

5. The analog digital data convertor according to claim 4, wherein the filtering unit comprises:
   a frequency information generating unit, configured to preset frequency information for frequency conversion;
   a plurality of multipliers, configured to multiply the preset frequency information for frequency conversion by the multiple groups of frequency shifted digital data respectively; and
   a filtering module, configured to filter the multiplied groups of digital data to remove outband information.

6. The analog digital data convertor according to claim 5, wherein the frequency information generating unit is a numerical controlled oscillator.

7. The analog digital data convertor according to claim 5, wherein the filtering module is an infinite impulse response (IIR) filter, or finite impulse response (FIR) filter, or half band filter (HBF) filter, or cascaded integrator comb (CIC) filter.

8. The analog digital data convertor according to claim 4, wherein the combining unit comprises:
   a frequency information generating unit, configured to preset frequency information for frequency conversion;
   a plurality of multipliers, configured to multiply the preset frequency information for frequency conversion by the filtered multiple groups of digital data respectively; and
   an adder, configured to add up the multiplied groups of digital data, so that the multiple groups of digital data are distributed without overlap within the second preset bandwidth.

9. The analog digital data convertor according to claim 8, wherein the frequency information generating unit is a numerical controlled oscillator.

10. An analog digital conversion chip, comprising:
    a plurality of analog digital conversion cores, configured to convert multiple groups of analog data to multiple groups of digital data and perform frequency shift on the multiple groups of digital data, wherein the multiple groups of frequency shifted digital data are independently distributed within a first preset bandwidth;
    a filtering unit, configured to filter the multiple groups of frequency shifted digital data, to remove outband information; and
    a combining unit, configured to distribute without overlap the filtered multiple groups of digital data within a second preset bandwidth.

11. The analog digital conversion chip according to claim 10, wherein the filtering unit comprises:
    a frequency information generating unit, configured to preset frequency information for frequency conversion;
    a plurality of multipliers, configured to multiply the preset frequency information for frequency conversion by the multiple groups of frequency shifted digital data respectively; and
    a filtering module, configured to filter the multiplied groups of digital data to remove outband information.

12. The analog digital conversion chip according to claim 11, wherein the frequency information generating unit is a numerical controlled oscillator.

13. The analog digital conversion chip according to claim 11, wherein the filtering module is an infinite impulse response (IIR) filter, or finite impulse response (FIR) filter, or half band filter (HBF) filter, or cascaded integrator comb (CIC) filter.

14. The analog digital conversion chip according to claim 10, wherein the combining unit comprises:
    a frequency information generating unit, configured to preset frequency information for frequency conversion;
    a plurality of multipliers, configured to multiply the preset frequency information for frequency conversion by the filtered multiple groups of digital data respectively; and
    an adder, configured to add up the multiplied groups of digital data, so that the multiple groups of digital data are distributed without overlap within the second preset bandwidth.

15. The analog digital data convertor chip according to claim 14, wherein the frequency information generating unit is a numerical controlled oscillator.

* * * * *